United States Patent
Raravikar et al.

(10) Patent No.: US 8,222,750 B2
(45) Date of Patent: Jul. 17, 2012

(54) ALIGNED NANOTUBE BEARING COMPOSITE MATERIAL

(75) Inventors: Nachiket Raravikar, Chandler, AZ (US); Ravindra Tanikella, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 717 days.

(21) Appl. No.: 12/364,435

(22) Filed: Feb. 2, 2009

(65) Prior Publication Data
US 2009/0192241 A1 Jul. 30, 2009

Related U.S. Application Data

(62) Division of application No. 11/479,246, filed on Jun. 29, 2006, now Pat. No. 7,534,648.

(51) Int. Cl.
*H01L 21/00* (2006.01)
(52) U.S. Cl. .................. 257/789; 257/40; 977/700
(58) Field of Classification Search .................. 257/40, 257/789; 977/700
See application file for complete search history.

(56) References Cited

U.S. PATENT DOCUMENTS

| | | | |
|---|---|---|---|
| 7,274,078 B2* | 9/2007 | Jaiprakash et al. | 257/414 |
| 7,327,039 B2* | 2/2008 | Charles et al. | 257/778 |
| 7,465,605 B2* | 12/2008 | Raravikar et al. | 438/99 |
| 7,534,648 B2* | 5/2009 | Raravikar et al. | 438/99 |
| 7,553,681 B2* | 6/2009 | Raravikar et al. | 438/15 |
| 7,618,679 B2* | 11/2009 | Shekhawat et al. | 427/215 |
| 7,666,768 B2* | 2/2010 | Raravikar et al. | 438/487 |
| 7,700,943 B2* | 4/2010 | Raravikar et al. | 257/40 |
| 7,713,858 B2* | 5/2010 | Raravikar et al. | 438/612 |
| 7,781,260 B2* | 8/2010 | Sane et al. | 438/108 |
| 7,829,473 B2* | 11/2010 | Yoshizumi | 438/758 |
| 2002/0176650 A1* | 11/2002 | Zhao et al. | 385/16 |
| 2003/0218258 A1* | 11/2003 | Charles et al. | 257/783 |
| 2005/0279478 A1* | 12/2005 | Draper et al. | 162/280 |
| 2006/0269695 A1* | 11/2006 | Daly et al. | 427/598 |
| 2007/0096083 A1* | 5/2007 | Raravikar et al. | 257/40 |
| 2007/0134599 A1* | 6/2007 | Raravikar et al. | 430/325 |
| 2007/0222472 A1* | 9/2007 | Raravikar et al. | 324/765 |
| 2007/0298525 A1* | 12/2007 | Raravikar et al. | 438/14 |
| 2008/0002755 A1* | 1/2008 | Raravikar et al. | 374/100 |
| 2008/0012155 A1* | 1/2008 | Raravikar et al. | 257/789 |
| 2008/0067619 A1* | 3/2008 | Farahani et al. | 257/417 |
| 2008/0081386 A1* | 4/2008 | Raravikar et al. | 438/15 |
| 2008/0131658 A1* | 6/2008 | Wakharkar et al. | 428/137 |
| 2008/0224327 A1* | 9/2008 | Suh et al. | 257/782 |
| 2008/0233396 A1* | 9/2008 | Raravikar et al. | 428/367 |
| 2008/0280038 A1* | 11/2008 | Ward et al. | 427/249.17 |
| 2008/0305321 A1* | 12/2008 | Raravikar et al. | 428/323 |
| 2009/0065932 A1* | 3/2009 | Sane et al. | 257/737 |
| 2009/0192241 A1* | 7/2009 | Raravikar et al. | 523/200 |
| 2010/0155690 A1* | 6/2010 | Napolitano et al. | 257/5 |
| 2010/0283046 A1* | 11/2010 | Uchida | 257/40 |
| 2011/0151624 A1* | 6/2011 | Xu et al. | 438/114 |

OTHER PUBLICATIONS

N.R. Raravikar et al.: "NANO MICRO SMALL, Embedded Carbon-Nanotube-Stiffened Polymer Surfaces"; 2005, 1, No. 3, pp. 317-320, Wiley-VCH GmbH & Co. KGaA, D-69451 Weinheim.

(Continued)

*Primary Examiner* — Laura Menz
(74) *Attorney, Agent, or Firm* — Blakely, Sokoloff, Taylor & Zafman LLP

(57) ABSTRACT

A composite material including an arrangement of approximately aligned nanofilaments overlying at least another arrangement of approximately aligned nanofilaments, the longitudinal axis of the nanotubes of the first arrangement being approximately perpendicular to the longitudinal axis of the nanotubes of the other arrangement, and the arrangements forming at least one array. A resin material having nanoparticles dispersed throughout is disposed among the array(s) of nanofilaments, and cured, and openings may be formed into or through the composite material corresponding to spaces provided in the array of nanofilaments. A composite material according to embodiments forms a microelectronic substrate or some portion thereof, such as a substrate core.

9 Claims, 9 Drawing Sheets

OTHER PUBLICATIONS

Dongmok Whang et al.; Large-Scale Hierarchical Organization of Nanowire Arrays for Integrated Nanosystems; Nano Letters, Published on Web Jan. 22, 2005, vol. 3, No. 9, pp. 1255-1259, American Chemical Society.

Praveen Bhimaraj; "Friction and Wear Properties of Pet Nanocomposites: The Role of Matrix Morphology, Nanoparticles and Interface"; Jun. 2004, pp. i-xix and 1-152, Rensselaer Polytechnic Institute, Troy, New York.

Nachiket R. Raravikar et al., "Synthesis and Characterization of Thickness-Aligned Carbon Nanotube-Polymer Composite Films", Chem. Mater., 2005, 17 (5), 974-983, American Chemical Society, Washinton D.C. 20036.

* cited by examiner

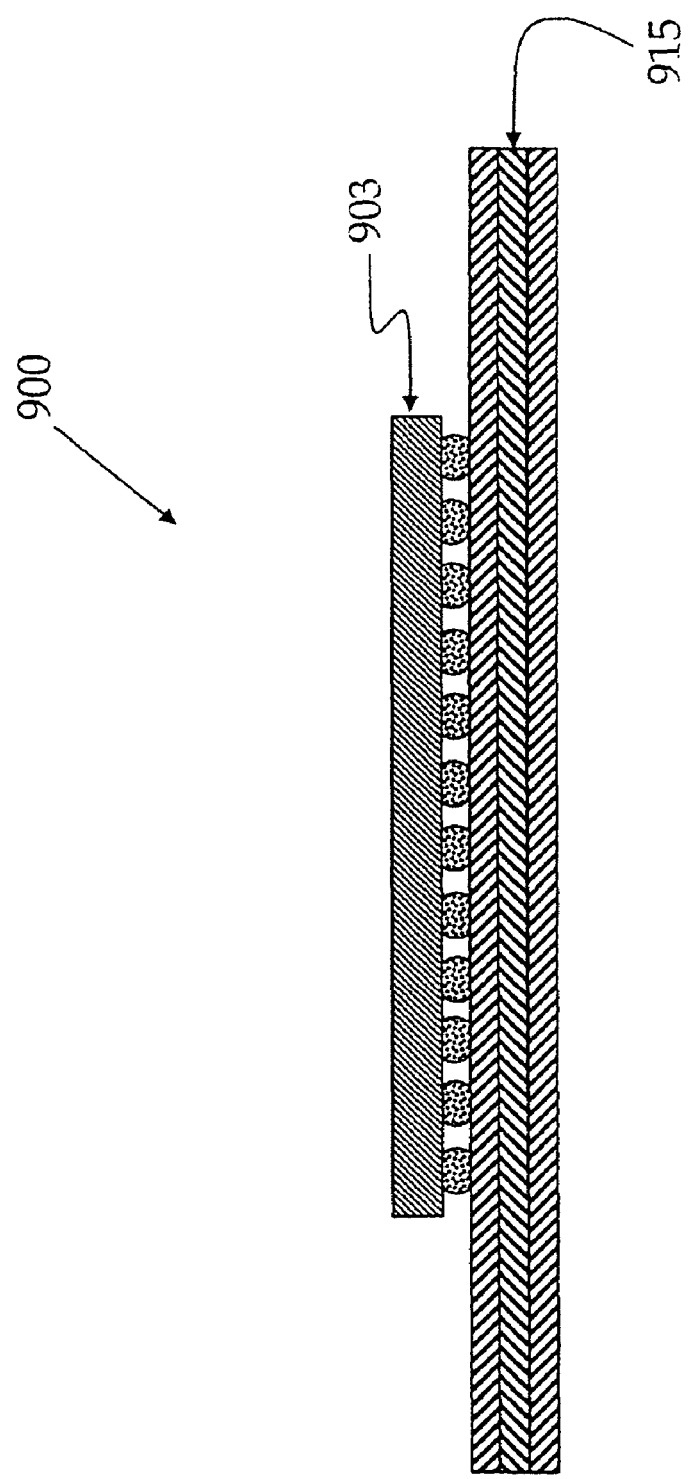

ALIGNED NANOTUBE BEARING COMPOSITE MATERIAL

This is a Divisional Application of Ser. No. 11/479,246 filed Jun. 29, 2006 now U.S. Pat. No. 7,534,648.

FIELD OF THE INVENTION

The invention relates generally to the field of semiconductor manufacturing. In particular, the invention relates to composite materials for substrates and substrate cores.

BACKGROUND OF THE INVENTION

Modern high performance microelectronic devices (e.g. semiconductor chips) operate at substantially higher temperatures than their predecessors, which can lead to numerous performance and reliability problems. Some devices operate at temperatures high enough to ignite certain materials, presenting a thoroughly unacceptable fire danger. Some materials expand or contract in response to thermal variations at higher rates than other materials. When two or more materials with different coefficients of thermal expansion (CTE) are used in a microelectronic assembly, the extreme variance between operative and inoperative temperatures can cause materials to separate from one another, leading to device failure. High temperatures can also cause some materials to soften, particularly organic sheet materials, leading to structural and/or electrical failures in microelectronic assemblies.

As a result, a microelectronic assembly must be able to efficiently dissipate heat away from a high temperature microelectronic device. When designing and manufacturing electronic assemblies, the materials used to form substrates, packages, and other components closely associated with high temperature microelectronic devices must not only be able to withstand high temperatures without being damaged, but must also be highly thermally conductive.

Some methods used to increase the stiffness and lower the CTE of substrates or substrate core materials, include adding or increasing the amount of ceramic or glass filler (fiber) in the substrate materials. While this provides some benefits, it also reduces the manufacturability of substrates. In particular, it interferes with formation of holes through the substrate, such as plated through holes, by increasing the wear rate of drill bits, increasing the time required to drill holes, and reducing the number of substrates that may be drilled in a single drilling operation. Further, the reliability of the core material can be detrimentally affected by the increased amount of glass or ceramic filler.

Another approach is to use coreless substrates, but these can have problems such as increased warpage, low machinability, and blistering. Current materials and approaches simply do not provide a solution which combines reliability with highly efficient thermal dissipation in high temperature conditions.

BRIEF DESCRIPTION OF THE DRAWINGS

FIG. 9 depicts an embodiment of a microelectronic package.

DETAILED DESCRIPTION OF THE INVENTION

Figure 1:
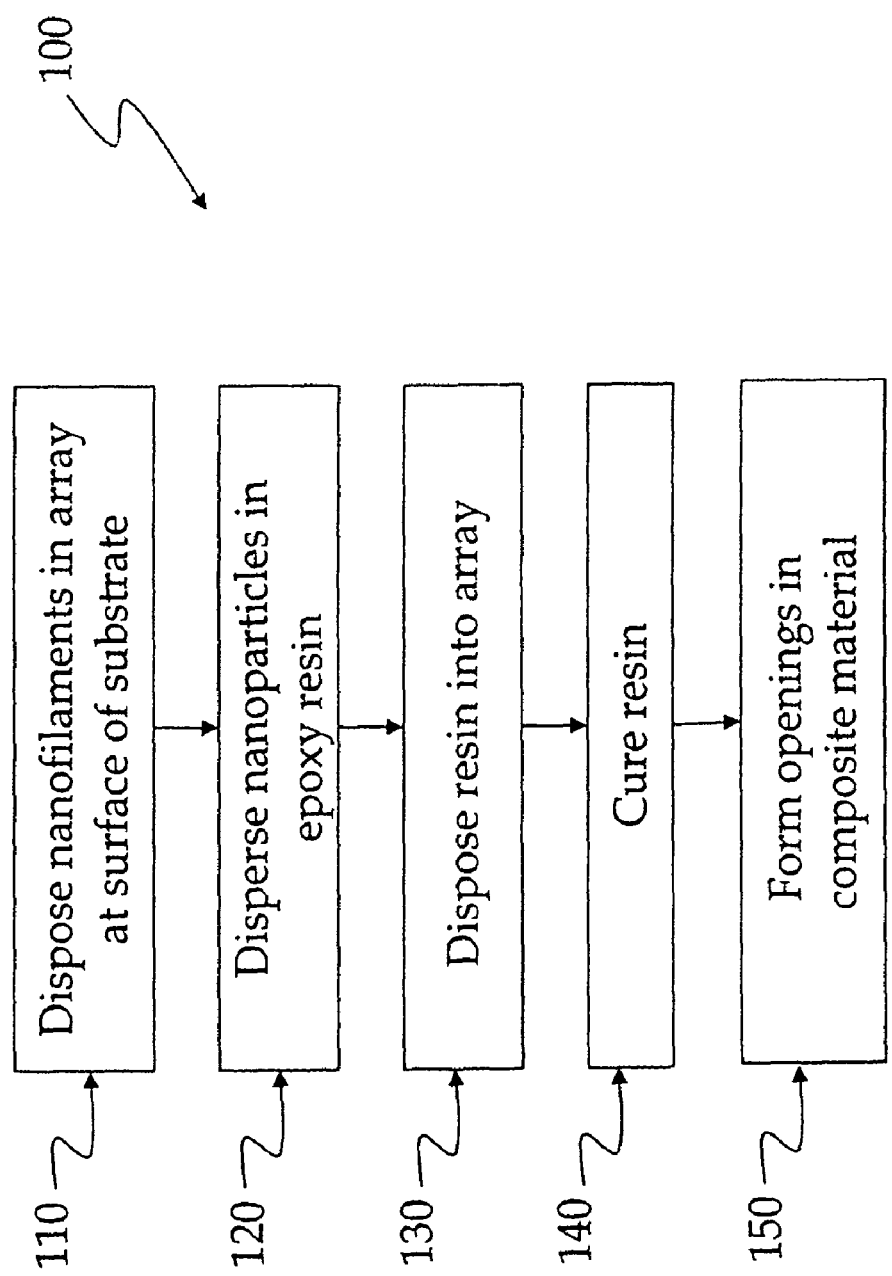
FIG. 1 depicts an embodiment of a method for forming a composite substrate core.

As depicted at 110 in FIG. 1, an embodiment of a method 100 includes disposing nanofilaments in an array at a surface of a substrate. Nanofilaments may include single-walled or multi-walled nanotubes (SWNT and MWNT, respectively) formed of carbon or boron nitride, or carbon nano-fibers. For some embodiments of electrically non-conductive substrates or substrate cores, electrically insulating nanotubes such as boron nitride are used. Conversely, for electrically conductive substrates or substrate cores, carbon nanotubes or carbon nanofibers can be used. Carbon nanofibers typically cost less than either carbon or boron nitride nanotubes, but have a lower thermal conductivity than either type of nanotube. Therefore, the electrical and/or thermal requirements of the microelectronic device in which an embodiment of the invention is implemented will influence the choice of which nanofilaments to use.

At least one embodiment for disposing nanofilaments thusly employs the Langmuir-Blodgett technique, wherein a monolayer of nanofilaments and surfactant are uniaxially compressed on an aqueous sub-phase, and the resulting axially aligned (along the long axis) nanofilaments are then transferred to a planar surface of a substrate, (e.g., a silicon substrate). The separation distance between centers of adjacent nanofilaments is controlled by the compression process, producing an arrangement 200 of approximately parallel (aligned) nanofilaments 201 at the substrate surface 250, as depicted in FIG. 2a.

A plurality of arrangements may be formed as described above. As in the embodiments depicted in FIGS. 2b and 2c, at least a second arrangement 202 of approximately aligned nanofilaments 203 is produced and disposed at a surface of a substrate 251, with the long axis of the nanofilaments 203 oriented differently from those of the first arrangement. For example, the nanofilaments 203 in the arrangement 202 depicted in FIG. 2b are disposed and orientated approximately perpendicularly to those depicted in FIG. 2a. Embodiments of the invention include disposing an arrangement of aligned nanofilaments at a substrate surface 252 so as to superimpose at least one other arrangement of nanofilaments already disposed at the substrate surface 252, wherein the nanofilaments 205 of one arrangement are aligned and oriented approximately perpendicular to the nanofilaments 206 of the other arrangement to form an array 204 of nanofilaments in a crisscross pattern as in FIG. 2c. Accordingly, at least one nanofilament 205 in one arrangement will cross over at least one nanofilament 206 of the other arrangement, as shown at 207. Although nanofilaments 205, 206 of an array 204 so formed have some nominal thickness, the thickness of the overall array 204 remains sufficiently small, such that nanofilaments 205, 206 of the arrangements within the array 204 are approximately coplanar with each other, with respect to the substrate.

Figure 2:
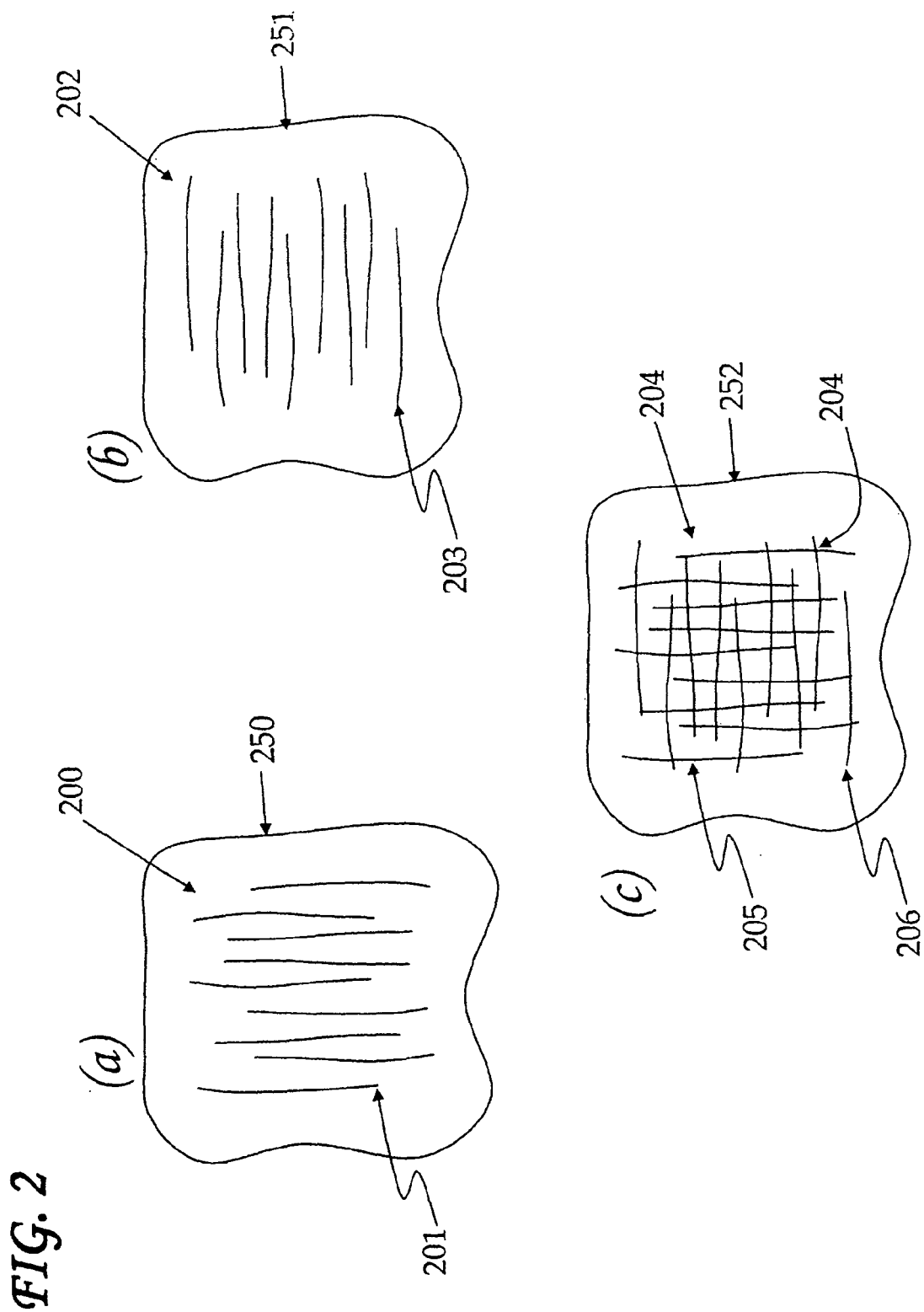
FIGS. 2a-b depict embodiments of aligned nanofilaments disposed at a surface of a substrate.
FIGS. 2c and 3 depict embodiments of an array of nanofilaments disposed at a surface of a substrate.
Figure 3:
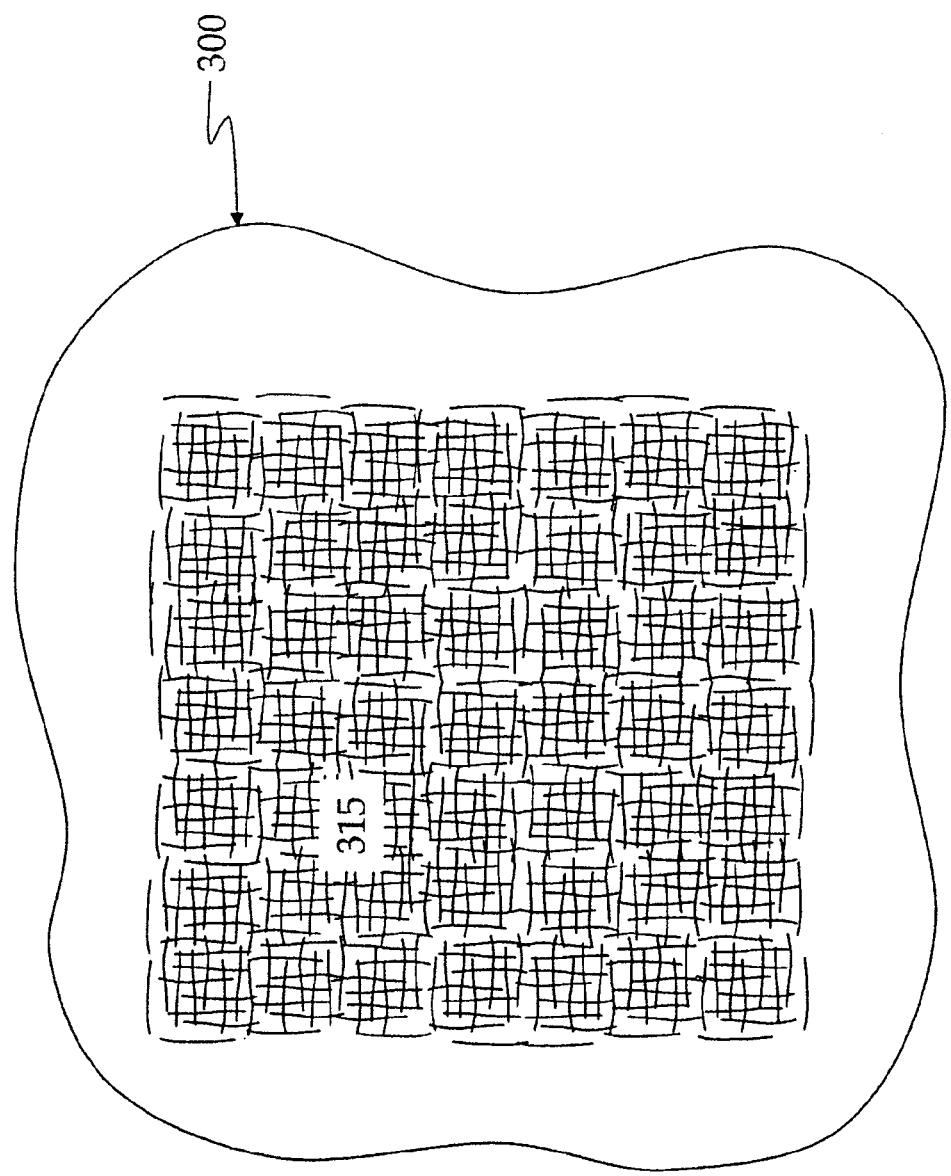
Figure 5:
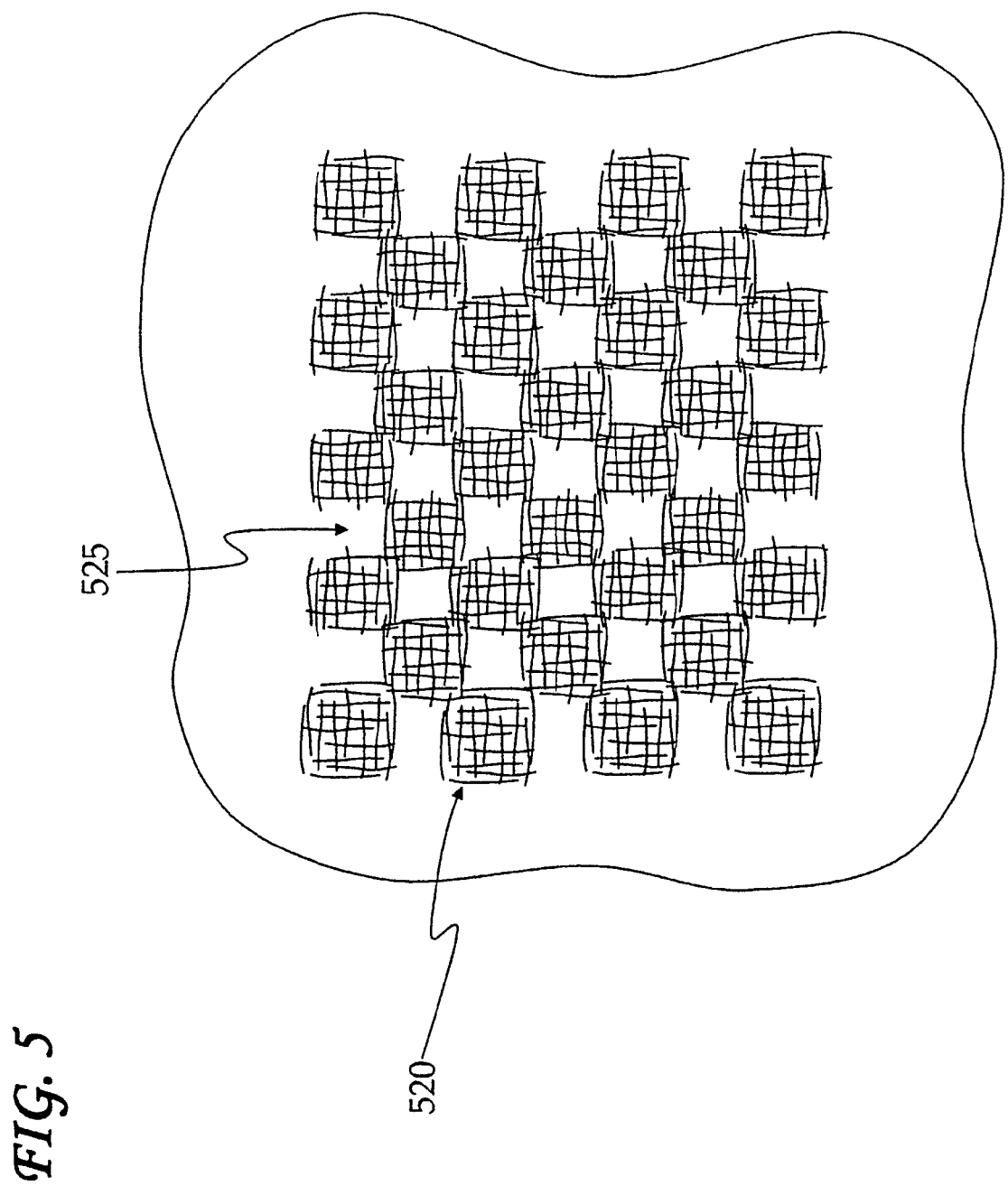

While FIG. 2c depicts a relatively small array, an exemplary embodiment includes an arrangement of a plurality of such relatively small arrays 520, as depicted in FIG. 5. Other exemplary embodiments include a relatively larger array 315 formed at a surface of a substrate 300, as depicted in FIG. 3, or a combination of relatively larger and relatively smaller arrays. A relatively larger array 315 may also be formed by combining a plurality of relatively smaller arrays 204 placed closely together at the surface of a substrate 300. In such embodiments, a portion of the periphery of each adjacent array can overlap a portion of the periphery of at least one other adjacent array to eliminate gaps between the arrays, or be placed closely proximate to each other without overlapping. In this way, nearly any size of array is formed by combining a plurality of arrays at the surface of a substrate.

Figure 4:
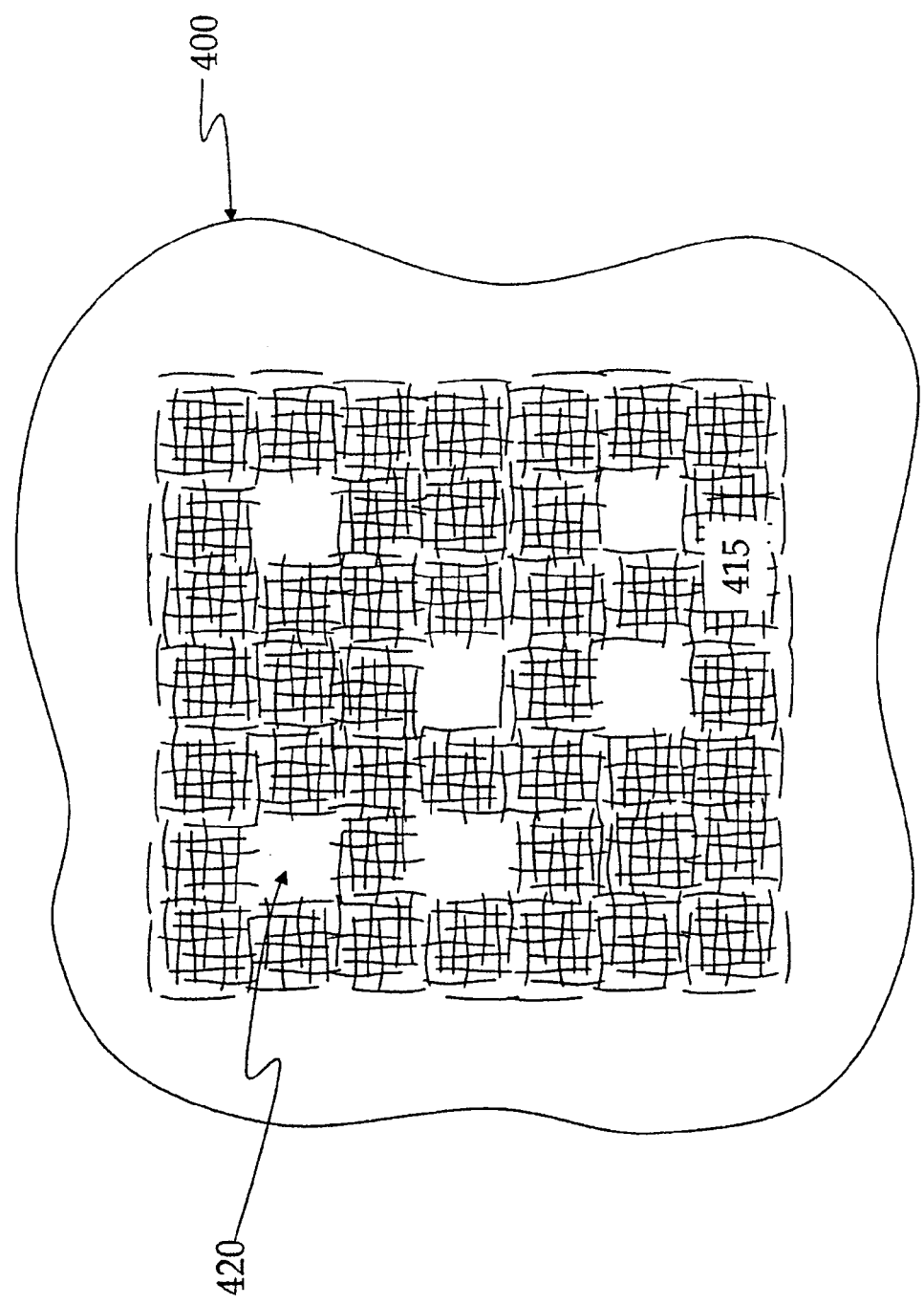
FIGS. 4 and 5 depict embodiments of an array of nanofilaments with spaces formed in the array.

An embodiment of a relatively larger array 415, depicted in FIG. 4, also includes spaces 420 formed in the array 415 among the plurality of nanofilaments. A space 420 provided in an array 415 is an area at a surface of a substrate 400, within the boundaries of which few or no nanofilaments are disposed. The size and position of the spaces 420 within the array 415 generally correspond to the size and position of holes formed in embodiments of a composite material, as will be described. For example, if holes with a diameter of approximately 300 micrometers ('microns', or 'µm') are to be formed, with an approximately 400-600 µm pitch between centers of adjacent holes, spaces 420 provided in the array 415 will generally also have their centers positioned at approximately a 400-600 µm pitch, and a minimum clear area (without nanofilaments) of approximately 300 µm as measured in any direction within the boundaries of each space 420. Embodiments of the invention will typically vary substantially according to the requirements of different product designs in which they are to be used. Therefore, the design requirements will impact the size and position of spaces 420 to be provided within an array 415. Likewise, spaces 525 can be provided between arrays 520 in embodiments including a plurality of relatively smaller arrays 520, as in FIG. 5, and the design requirements will drive the layout and spacing of the arrays 520 relative to each other and relative to locations where holes are to be provided.

In one embodiment, nanofilaments are initially disposed only in those areas at the surface of a substrate corresponding to the array, but not disposed in those areas corresponding to a space. In another embodiment, spaces are formed by selectively removing nanofilaments in an area corresponding to a space after an array has been formed at a surface of a substrate. For example, areas of a substrate surface corresponding to a space are treated with a sacrificial material. After disposing nanofilaments at the surface of the substrate, including such treated areas, the sacrificial material is removed, also removing the nanofilaments disposed in the treated areas. In another example, after an array is formed at a surface of a substrate, a masking layer is disposed over the array with openings formed in the masking layer corresponding with areas where spaces are to be formed. Nanofilaments exposed by the openings are treated with a surfactant, a solvent, or some other agent capable of removing the nanofilaments from the surface of the substrate. Once spaces are formed, the masking layer is removed leaving an array having spaces formed in areas corresponding to holes.

As shown at 120 and 130 in FIG. 1, nanoparticles are dispersed throughout an uncured epoxy resin, and the resin is disposed among the nanofilaments of an array at the surface of a substrate. Using nanoparticles as fillers in an epoxy resin provides numerous benefits, including improved thermal stability, due to the low coefficient of thermal expansion (CTE) of nanoparticles, greater flame retardancy, reduced epoxy resin viscosity, and improved adhesion to external surfaces of a composite material formed with the epoxy resin. Depending on the epoxy resin used and what performance characteristics are desired in a particular application, the level of nanoparticle loading can be increased or decreased to alter those characteristics.

According to alternate embodiments, nanoparticles are alumina or silica nanoparticles with a diameter of approximately 30 nanometers ('nm'). In an exemplary embodiment, a loading of approximately 0.5-1.0 weight percent (%) of nanoparticles are dispersed in an uncured epoxy resin by conventional sonication or a solution mixing process. In other embodiments, nanoparticle loadings levels of up to approximately 3.0 weight % are used without significant difficulties in nanoparticle dispersal or epoxy resin viscosity. As the increase in nanoparticle loading levels increases, uniform dispersal of nanoparticles throughout an epoxy resin can become more difficult, and/or the viscosity of a resin can increase, potentially hindering complete dispersal of epoxy resin among a nanofilaments array. If relatively higher levels of nanoparticle loading are beneficial to a substrate or substrate core, for example, up to approximately 10-15 weight % of nanoparticles, an epoxy with a lower initial viscosity can accommodate relatively higher loading while still providing sufficient infiltration into a nanofilaments array. In embodiments with relatively low nanoparticle loading, generally untreated particles will be used. However, in embodiments with relatively higher levels of nanoparticle loading, or when dispersion of nanoparticles throughout an epoxy resin is poor, silane-treated nanoparticles will also generally provide enhanced dispersion characteristics.

Figure 6:
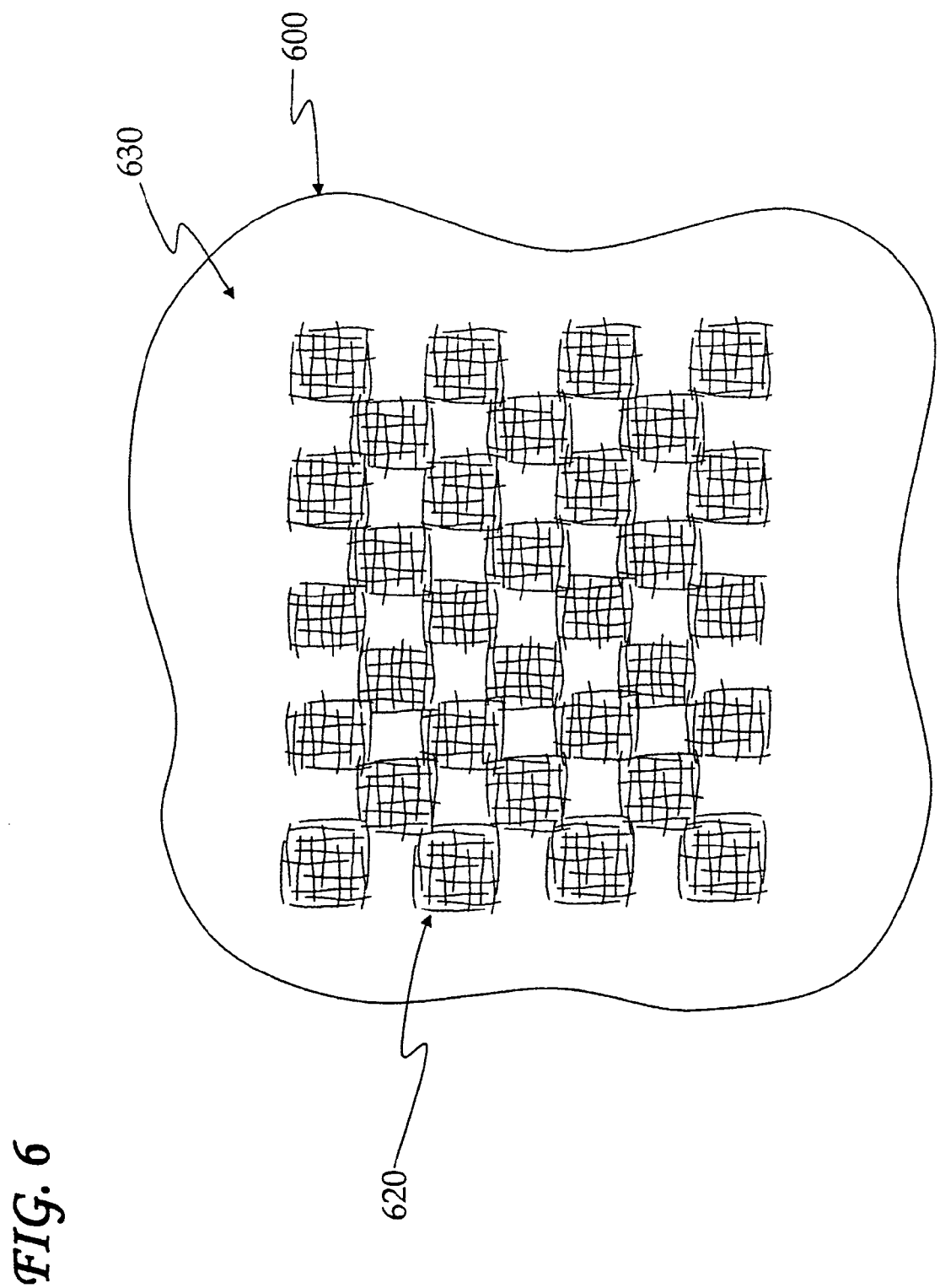
FIG. 6 depicts an embodiment of a nanoparticle-filled epoxy resin disposed among nanofilaments of an array.
Figure 7:
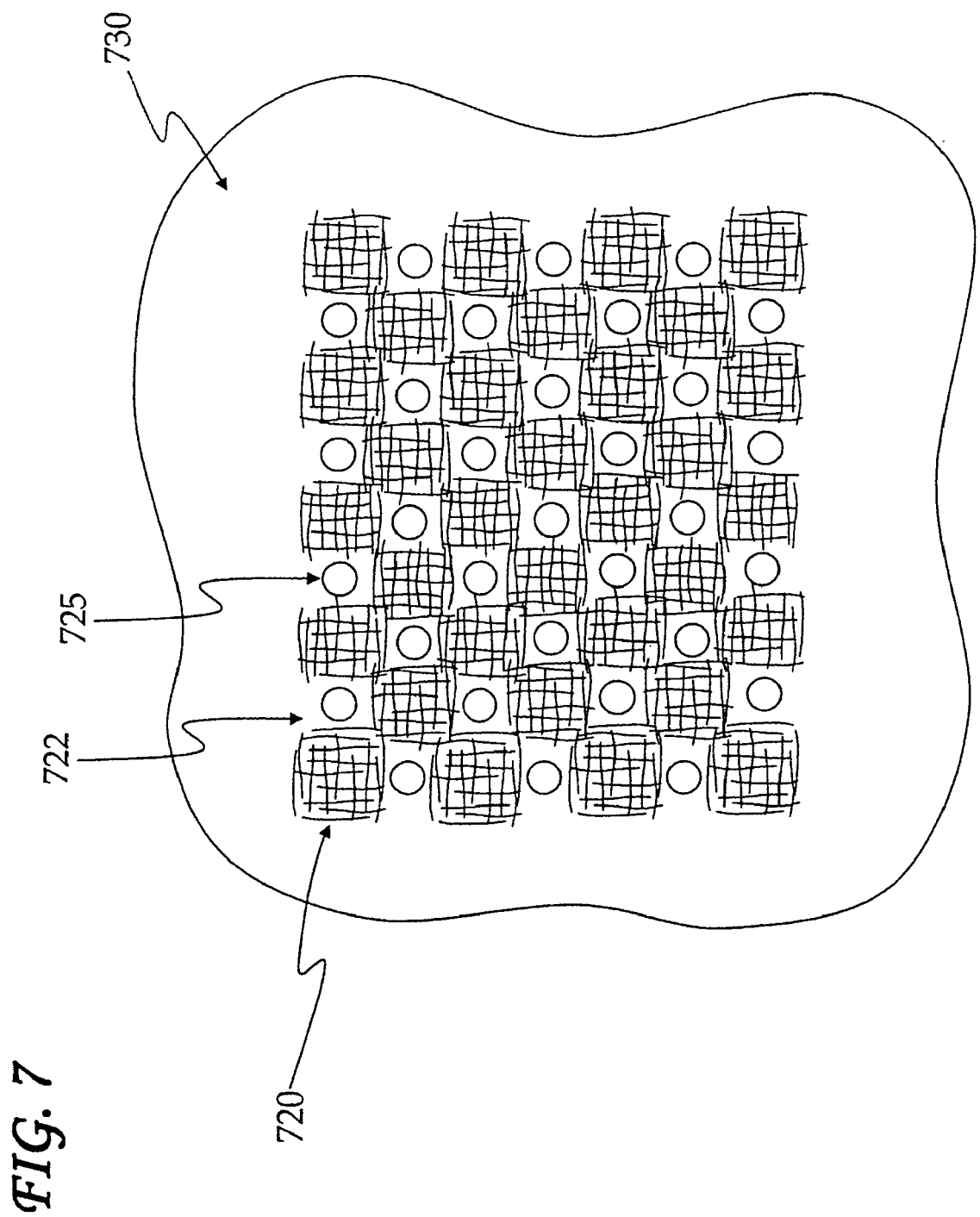
FIG. 7 depicts an embodiment of openings formed corresponding to spaces formed among nanofilaments of an array.

As depicted in an exemplary embodiment in FIG. 6, nanoparticle loaded epoxy resin 630 is disposed at the surface of the substrate 600, and the resin 630 infiltrates among the arrangements of nanofilaments constituting the array(s) 620. Epoxy resins, according to embodiments, are any of a class of organic, generally viscous liquid resins, including thermosetting or thermoplastic modified resins typically used in semiconductor or electronic packaging applications. When so used, epoxy resins can be functionalized to improve thermomechanical and/or electrical properties, adhesion, and other beneficial properties. In embodiments, epoxy resins include ether linkages and epoxy groups. When used in conjunction with hardeners, curing agents, or catalysts, epoxy resins produce resin systems/networks with excellent electrical and/or thermomechanical properties and good chemical resistance. Although an exemplary embodiment of epoxy resin is referred to throughout this description, the embodiments are not so-limited. Non-epoxy based resin systems including but not limited to novalac-based, cyanate ester-based, biamaleimde-based, and/or polymide-based systems are used according to other embodiments.

As most organic liquids are known to wet the surface of nanotubes, a good interface will generally form between the nanofilaments and epoxy resin 630. As described, an epoxy resin having a relatively low viscosity will tend to infiltrate more easily among the nanofilaments of an array 620 than an epoxy resin with a relatively higher viscosity, but embodiments of the invention are not so limited. A number of factors can contribute to effective infiltration of even a relatively more viscous epoxy resin 630, including the separation distance between nanofilaments, type and diameter of nanofilaments in the array, the number of overlying arrangements of nanofilaments in the array and the alignment angles of nanofilaments in the respective arrangements.

As depicted at 140 in FIG. 1, the disposed nanoparticle-epoxy resin mixture is then cured in situ. Curing is preceded in embodiments by degassing, to remove dissolved gasses from the epoxy resin. Curing of thermoset epoxy resins is achieved by exposing the resin to elevated thermal conditions, according to some embodiments. Curing of epoxy resins in other embodiments is achieved by mixing the resin with an amine or anhydride curing agent, producing a catalytic polymerization reaction. However curing is carried out in alternate embodiments, a cured epoxy resin forms a relatively hard, resistant plastic composite material including the array(s) of nanofilaments and dispersed nanoparticles.

Following curing of the epoxy, the resulting composite material is separated from the substrate according to numerous embodiments. In one embodiment, the composite material is delaminated from the substrate by applying a mechanical force sufficient to overcome the adhesive force bonding the composite material with the substrate. For example, a mechanical force generated by forcing a wedge into the interface between the composite material and the substrate will exert a separating force, as will a peeling force caused by pulling a substrate and a composite material in opposite directions. Delamination can be aided by applying a release material to the surface of the substrate prior to disposing the nanofilaments and epoxy at the substrate surface, and/or by using a surfactant during separation, thus reducing the adhesive forces between the composite material and the substrate. In another embodiment, a sacrificial material is disposed at the surface of the substrate prior to disposing the nanofilaments and forming the composite material. After forming the composite material, the sacrificial material is dissolved by exposure to a solvent or by heating and melting the sacrificial material, thus releasing the composite material from the substrate. In still another embodiment, the substrate itself is a sacrificial material that may be dissolved, abrasively ground away, or otherwise destructively removed from the composite material. In other embodiments, however, the substrate remains coupled with the composite material, and forms a portion of a microelectronic substrate or substrate core.

As a portion of a substrate or substrate core, a composite material may be in contact with other electrically conductive materials or elements, such as conductive pathways or planes. In such situations, an electrically conductive composite material could cause electrical shorting between the conductive elements, or between one conductive layer and another conductive layer or elements comprising portions of a microelectronic substrate. To prevent shorting in embodiments, a non-conductive masking material is disposed at the surface of at least a portion of the conductive composite material, interposed between the conductive composite material and the conductive elements or layers. A non-conductive masking material includes a polymer, a spin-on glass (SOG) material, a nitride or oxide material (e.g., silicon nitride), or another non-conductive material, according to various embodiments. In other embodiments, the non-conductive material comprises the substrate upon which the composite material was formed, or a layer formed between the substrate and the composite material, and used to separate the composite material from the substrate. A non-conductive masking material may be disposed across an entire surface of a composite material or only selected portions of it, as needed to prevent electrical shorting.

As depicted in FIG. 1 at 150, openings 725 (e.g., holes) are formed through the composite material 730 in embodiments. In some embodiments, openings 725 in a composite material 730 align with corresponding openings in other materials of a microelectronic substrate to provide an opening formed from one exterior surface of a substrate through to another exterior surface of the microelectronic substrate, (e.g., through holes). In other embodiments, openings 725 formed in a composite material 730 are presented to an exterior surface of a microelectronic substrate, but are not formed through to and presented at another exterior surface of the microelectronic substrate, (e.g., blind vias). Openings 725, in an exemplary embodiment, are formed as plated through holes, which may include vias, microvias, or other conductive through structures of a microelectronic substrate.

Openings 725 are formed in embodiments by drilling though a composite material 730 in an area corresponding to a space 722 provided in the nanofilament array(s) 720. Drilling may be accomplished using a drill bit, a laser, by selective etching (e.g., dry etch), or other methods. In an exemplary embodiment, projecting members, having a diameter corresponding to the diameter of an opening 725 to be formed, are provided extending approximately perpendicularly from the surface of the substrate at which a composite material 730 is to be formed. When the epoxy resin is disposed at the surface of the substrate, it flows around and includes at least a portion of the projecting member. When the composite material 730 is separated from the substrate, the projecting members are also withdrawn from the composite material 730, leaving openings formed through the composite material 730, similar to techniques sometimes used in injection molding and other molding processes to form openings in a single molding step. In another similar embodiment, the projecting members are not withdrawn from the composite material 730, but may be a sacrificial material that is dissolved or otherwise destructively removed, leaving an opening in each portion of the composite material 730 previously occupied by a projecting member. In still another embodiment, such as when the substrate remains coupled with the composite material 730, the projecting members are separated from the substrate and independently withdrawn from the composite material 730 to leave openings 725. Another embodiment includes an assembly including projecting members attached to a main body portion of the assembly, and arranged to correspond to openings 725 to be formed in a composite material 730. This assembly is placed so that the ends of each projecting member opposite from the main body portion are in simultaneous contact with or at least partially penetrate the surface of the substrate. The epoxy resin is then disposed and cured, and the assembly is used to simultaneously withdraw all projecting members, leaving openings in the composite material 730. The embodiments described above are not limiting, and are not to be construed as excluding openings 725 formed by different approaches in other embodiments.

As described, embodiments of the invention comprise a composite material including an arrangement of approximately aligned nanofilaments overlying at least another arrangement of approximately aligned nanofilaments, the longitudinal axis of the nanotubes of the first arrangement being approximately perpendicular to the longitudinal axis of the nanotubes of the other arrangement, and the arrangements forming at least one array. An epoxy material having a nanoparticles dispersed throughout is disposed among the array(s) of nanofilaments, and cured, and openings may be formed into or through the composite material corresponding to spaces provided in the array of nanofilaments. A composite material according to embodiments forms a microelectronic substrate or some portion thereof, such as a substrate core.

Figure 8:
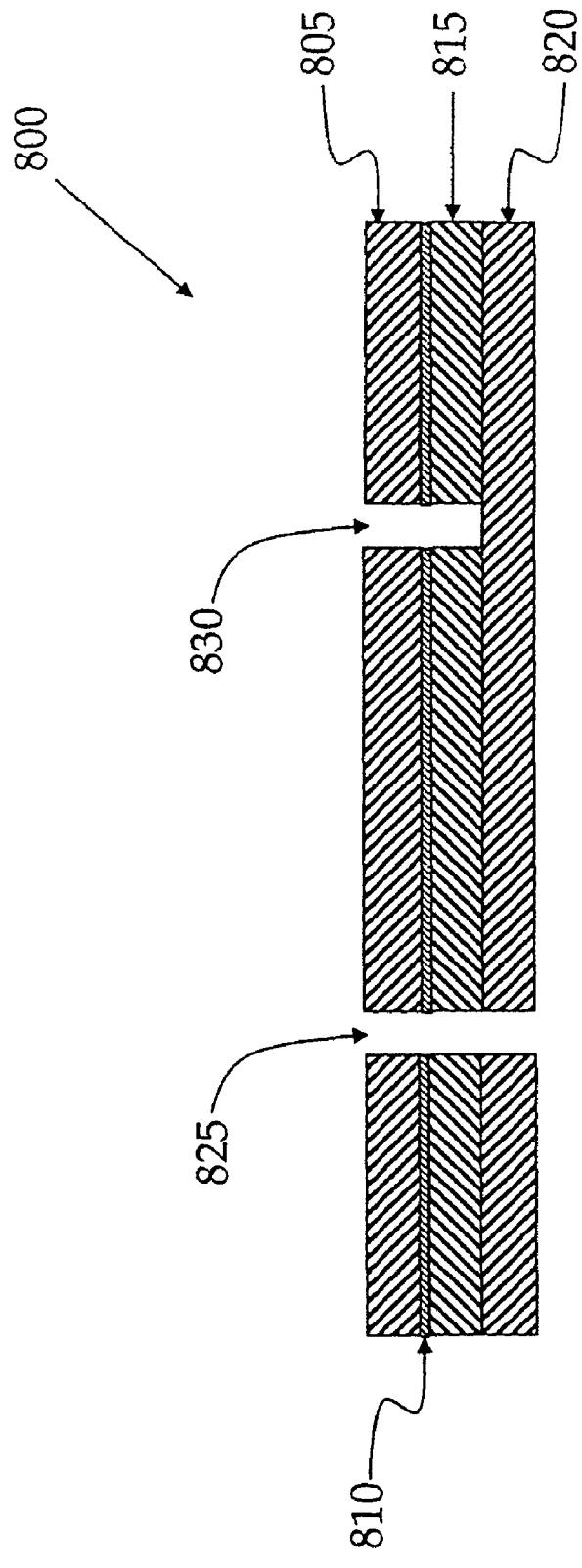
FIG. 8 depicts a cross-sectional view of an embodiment of a microelectronic substrate including a composite substrate core material.

A microelectronic substrate is a package substrate 800, as in FIG. 8, to which a semiconductor device is physically and/or electrically coupled to form a semiconductor package in an embodiment of the invention. In embodiments where a composite material 815 forms a substrate core, the overall substrate 800 containing the composite substrate core 815 is likewise used as a microelectronic substrate for a semiconductor package. A composite material 815 will be an interior layer (e.g. substrate core) of a microelectronic substrate 800 located between adjacent materials 805, 820 in embodiments as depicted in FIG. 8, or will be an outer layer, or a plurality of layers of a microelectronic substrate 800. In embodiments, a nonconductive mask layer 810 is disposed between a surface of a composite substrate core 815 and another layer 805, material, or feature (i.e. conductive feature) of a microelectronic substrate 800. Openings formed through a composite substrate core may transit completely through the microelectronic substrate, as at 825, or they may penetrate only partially though the microelectronic substrate, as at 830.

As in an embodiment depicted in FIG. 9, a composite substrate core material forms a portion of a microelectronic device package 900 comprising a microelectronic device 903 electrically and/or physically coupled with a microelectronic substrate 915. A microelectronic device package 900, according to alternate embodiments, is used in a computer system such as a normally stationary computer system (e.g., desktop or server) or a portable computer system (e.g., notebook computer, palmtop computer, tablet), a portable audio playing system (e.g., memory chip or disc drive based audio players), a video game system (e.g., configured for connection to a television display), or another electronic system. A microelectronic device package, according to alternative embodiments, include a flip chip device, a multichip module, a multiple-core single chip device, or others as are known and used in electronic systems.

The foregoing detailed description and accompanying drawings are only illustrative and not restrictive. They have been provided primarily for a clear and comprehensive understanding of the embodiments of the invention, and no unnecessary limitations are to be understood therefrom. Numerous additions, deletions, and modifications to the embodiments described herein, as well as alternative arrangements, may be devised by those skilled in the art without departing from the spirit of the embodiments and the scope of the appended claims.

We claim:

1. A composite material, comprising:
   a resin;
   a plurality of nanoparticles dispersed within the resin; and
   at least one array of nanofilaments at least partially included within the resin, the nanofilaments forming a first approximately aligned arrangement and a second approximately aligned arrangement, the second arrangement being approximately perpendicular to and approximately coplanar with the first arrangement, and at least one nanofilament of the second arrangement crossing over at least one nanofilament of the first arrangement.

2. The composite material of claim 1, further comprising at least one space provided at least one of between adjacent nanofilaments of an array and between adjacent arrays of a plurality of arrays.

3. The composite material of claim 2, wherein at least one of a position and a size of a space formed in the composite material corresponds with a position and a size of opening to be formed in the composite material.

4. The composite material of claim 2, further comprising at least one opening provided in the composite material at a location corresponding with the space.

5. The composite material of claim 4, wherein the opening is a plated through-hole (PTH).

6. The composite material of claim 1, wherein the nanofilaments are at least one selected from the group consisting of carbon nanofibers, carbon nanotubes, and boron nitride nanotubes.

7. The composite material of claim 1, wherein the nanoparticles are selected from one of a group consisting of untreated silica nanoparticles, silane coated silica nanoparticles, untreated alumina nanoparticles, and silane coated alumina nanoparticles.

8. The composite material of claim 1, wherein the composite material forms at least a portion of a microelectronic substrate.

9. The composite material of claim 1, wherein the resin is selected from one of a group consisting of epoxy-based, novalac-based, cyanate ester-based, biamaleimde-based, and polymide-based resin systems.

* * * * *